United States Patent
Huang et al.

(10) Patent No.: US 9,883,594 B2
(45) Date of Patent: Jan. 30, 2018

(54) SUBSTRATE STRUCTURE FOR PACKAGING CHIP

(71) Applicant: Subtron Technology Co., Ltd., Hsinchu County (TW)

(72) Inventors: Yu-Chi Huang, Hsinchu County (TW); Kuo-Tung Lin, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 15/648,465

(22) Filed: Jul. 13, 2017

(65) Prior Publication Data

US 2017/0311450 A1 Oct. 26, 2017

Related U.S. Application Data

(62) Division of application No. 14/287,071, filed on May 26, 2014, now abandoned.

(30) Foreign Application Priority Data

Apr. 15, 2014 (TW) .............................. 103113683 A

(51) Int. Cl.
*H05K 3/00* (2006.01)
*H05K 3/34* (2006.01)

(52) U.S. Cl.
CPC .......... *H05K 3/007* (2013.01); *B32B 2457/08* (2013.01); *H01L 2224/48091* (2013.01); *H01L 2224/48227* (2013.01); *H05K 3/3421* (2013.01); *H05K 2201/0154* (2013.01); *H05K 2201/09072* (2013.01); *H05K 2203/0156* (2013.01)

(58) Field of Classification Search
None
See application file for complete search history.

(56) References Cited

U.S. PATENT DOCUMENTS

2004/0115862 A1* 6/2004 Kung .................. H01L 21/4857
   438/106
2015/0262927 A1* 9/2015 Kang ................ H01L 23/49822
   361/761

FOREIGN PATENT DOCUMENTS

CN     102376677    3/2012
TW     201044930    12/2010

OTHER PUBLICATIONS

"Office Action of China Counterpart Application," dated Jun. 2, 2017, p. 1-p. 5.

* cited by examiner

*Primary Examiner* — Thao X Le
*Assistant Examiner* — Xia Cross
(74) *Attorney, Agent, or Firm* — JCIPRNET

(57) ABSTRACT

A substrate structure including a carrier and a substrate is provided. The carrier includes a release layer, a dielectric layer and a metal layer. The dielectric layer is disposed between the release layer and the metal layer. The substrate includes a packaging region and a peripheral region. The peripheral region is connected to the packaging region and surrounds the packaging region. The peripheral region or the packaging region has a plurality of through holes. The substrate is disposed on the carrier. The release layer is located between the substrate and the dielectric layer. The release layer and the dielectric layer are filled in the through hole such that the substrate is separably attached to the carrier.

5 Claims, 9 Drawing Sheets

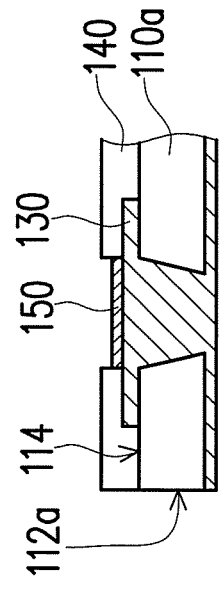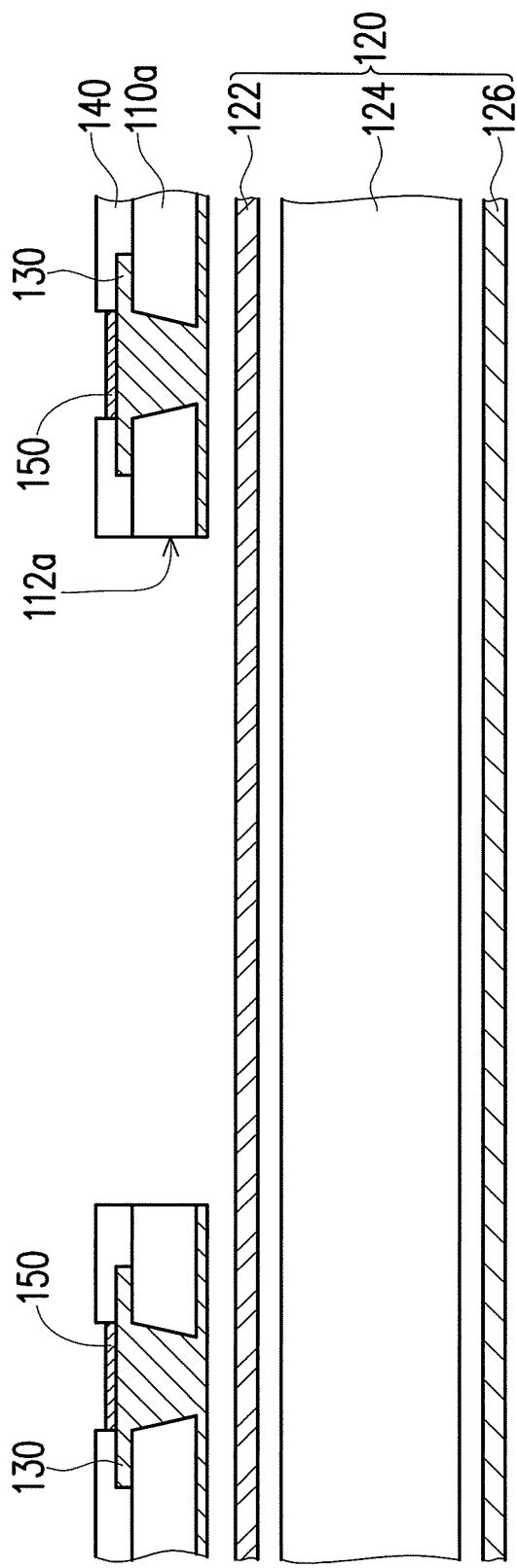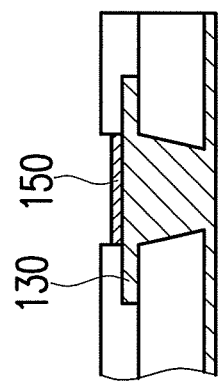
FIG. 4A
FIG. 4B

SUBSTRATE STRUCTURE FOR PACKAGING CHIP

CROSS-REFERENCE TO RELATED APPLICATION

This is a divisional application of and claims the priority benefit of U.S. patent application Ser. No. 14/287,071, filed on May 26, 2014, now pending, which claims the priority benefit of Taiwan patent application serial no. 103113683, filed on Apr. 15, 2014. The entirety of each of the above-mentioned patent applications is hereby incorporated by reference herein and made a part of this specification.

BACKGROUND OF THE INVENTION

1. Field of the Invention

The invention relates to a substrate structure, and particularly relates to a substrate structure having a preferable bonding strength or capable of providing a sensing space required by a sensing element of a package structure and meeting the need for filling paste or liquid and the need for ventilation of a package element.

2. Description of Related Art

Circuit substrates are used in a variety of electronic products for electrical signal transmission, power supply, and ground connection. Through miniaturization of electronic products, circuit substrates are also developed in the tendency of being more compact and having a more intensive circuitry. However, in the chip packaging process, the miniaturized substrates may be broken easily or have defects in wiring. To increase the yield rate and working efficiency of the process, the conventional way is to attach a plurality of non-defective substrates to a carrier through a release layer to improve the rigidity of the overall structure of the substrates, and the attached substrates and carrier are then sent for the subsequent chip packaging process. Then, the substrates packaged with chips are removed from the carrier. Thus, the adhesive characteristic of the release layer influences the bonding strength between the substrates and the carrier.

To prevent the substrates from being separated from the carrier during the process, a release layer having a greater adhesive force is usually used to ensure the substrates and the carrier are closely bonded. However, when a substrate is separated from the carrier, some adhesive material may remain on the back surface of the substrate due to the overly strong adhesive force of the release layer. If a release layer having a weaker adhesive force is used to avoid leaving the adhesive material on the substrate or to separate the substrate from the carrier easily, the issue that the substrate may be separated from the carrier during the process arises.

Therefore, the industry certainly needs a method that closely bonds the substrates and the carrier during the chip packaging process, while allows the substrates to be easily separated from the carrier.

SUMMARY OF THE INVENTION

The invention provides a substrate structure capable of improving a bonding strength between a substrate and a carrier while making the substrate and the carrier easy to separate.

The invention provides a manufacturing method of a substrate structure. The substrate structure manufactured according to the method has a higher bonding strength between a substrate and a carrier thereof and allows the substrate to be easily separated from the carrier.

The invention provides a substrate structure capable of providing a sensing space for a sensing element of a package structure and meeting the need for filling paste or liquid and the need for ventilation of a package element.

The invention provides a manufacturing method of a substrate structure. The substrate structure manufactured according to the method is capable of providing a sensing space for a sensing element of a package structure and meeting the need for filling paste or liquid and the need for ventilation of a package element.

The substrate structure of the invention includes a carrier and a substrate. The carrier includes a release layer, a dielectric layer, and a metal layer. The dielectric layer is disposed between the release layer and the metal layer. The substrate includes a packaging region and a peripheral region. The peripheral region is connected to the packaging region and surrounds the packaging region. The peripheral region has the plurality of through holes. The substrate is disposed on the carrier. The release layer is located between the substrate and the dielectric layer, and the release layer and the dielectric layer are filled into the through holes, such that the substrate is separably attached to the carrier.

The manufacturing method of the substrate structure of the invention provides steps as follows. First of all, a substrate is provided. The substrate includes a packaging region and a peripheral region. The peripheral region is connected to the packaging region and surrounds the packaging region. Pluralities of through holes are formed in the peripheral region. A carrier is provided. The carrier includes a release layer, a dielectric layer, and a metal layer. The dielectric layer is disposed between the release layer and the metal layer. The substrate is laminated to the release layer of the carrier, such that the release layer and the dielectric layer are filled into the through holes to separably attach the substrate to the carrier.

The substrate structure of the invention includes a carrier and a substrate. The carrier includes a release layer, a dielectric layer, and a metal layer. The dielectric layer is disposed between the release layer and the metal layer. The substrate includes a packaging region and a peripheral region. The peripheral region is connected to the packaging region and surrounds the packaging region. The packaging region has the plurality of through holes. The substrate is disposed on the carrier. The release layer is located between the substrate and the dielectric layer, and the release layer and the dielectric layer are filled into the through holes, such that the substrate is separably attached to the carrier.

The manufacturing method of the substrate structure of the invention provides steps as follows. First of all, a substrate is provided. The substrate includes a packaging region and a peripheral region. The peripheral region is connected to the packaging region and surrounds the packaging region. Pluralities of through holes are formed in the packaging region. A carrier is provided. The carrier includes a release layer, a dielectric layer, and a metal layer. The dielectric layer is disposed between the release layer and the metal layer. The substrate is laminated to the release layer of the carrier, such that the release layer and the dielectric layer are filled into the through holes to separably attach the substrate to the carrier.

According to an embodiment of the invention, a material of the release layer includes an aluminum foil or a polyimide (PI) film.

According to an embodiment of the invention, the substrate is a single-layer circuit board.

According to an embodiment of the invention, the substrate is a multi-layer circuit board.

According to an embodiment of the invention, the substrate further includes a plurality of pads and a patterned solder mask. The pads are disposed on an upper surface of the substrate and located within the packaging region. The patterned solder mask covers the upper surface of the substrate and exposes the pads.

According to an embodiment of the invention, the substrate further includes a surface finishing layer covering the pads.

According to an embodiment of the invention, the step of providing the substrate further includes forming a plurality of pads on an upper surface of the substrate. The pads are located within the packaging region. A patterned solder mask is formed on the upper surface. The patterned solder mask exposes the pads.

According to an embodiment of the invention, the step of forming the substrate further includes forming a surface finishing layer covering the pads.

According to an embodiment of the invention, the substrate structure further includes a chip disposed on the packaging region and covering one of the through holes to contact the release layer. The chip is electrically connected to the pads through a plurality of wires.

According to an embodiment of the invention, the manufacturing method of the substrate structure further includes disposing a chip in the packaging region of the substrate. The chip covers one of the through holes and contacts the release layer. The chip is electrically connected to the pads by a plurality of wires.

Based on the above, in the invention, the substrate is laminated to the carrier to squeeze the release layer and the dielectric layer of the carrier into the through holes of the substrate, so as to enhance the bonding strength between the substrate and the carrier. In addition, by utilizing the characteristic that the release layer is easily separated from the substrate, the substrate may be easily separated from the carrier without being damaged after the subsequent packaging process is completed. Thus, the invention not only enhances the bonding strength between the substrate and the carrier in the substrate structure, but also reduces the manufacturing difficulty and increases the yield rate of the manufacturing process.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIGS. 4A to 4E are cross-sectional schematic views illustrating the processes of a manufacturing method of a substrate structure according to an embodiment of the invention.

DESCRIPTION OF THE EMBODIMENTS

Figure 1A:
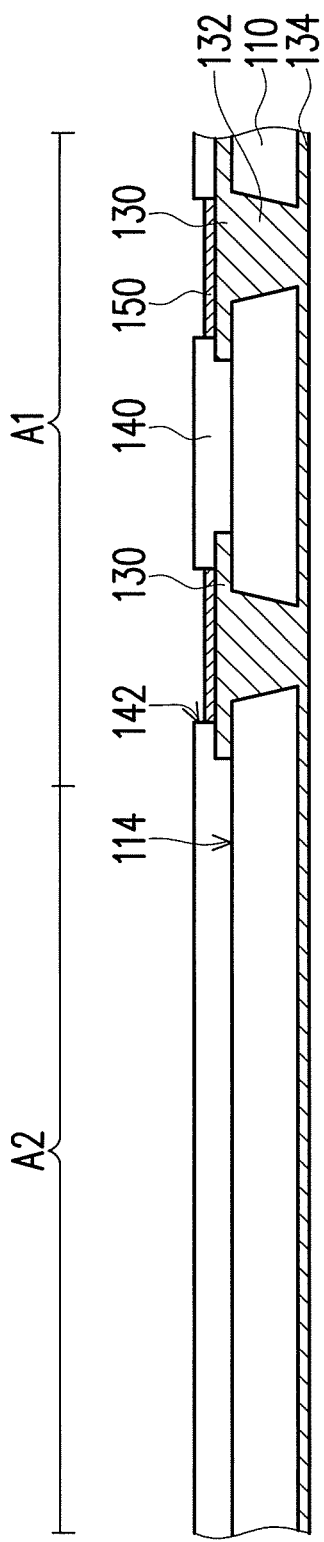
FIGS. 1A to 1D are cross-sectional schematic views illustrating the processes of a manufacturing method of a substrate structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are cross-sectional schematic views illustrating the processes of a manufacturing method of a substrate structure according to an embodiment of the invention. FIG. 2 is a top schematic view illustrating a substrate according to an embodiment of the invention. Referring to FIGS. 1A and 2, the manufacturing method of the substrate structure of this embodiment includes steps as follows. First of all, as shown in FIG. 1A, a substrate 110 is provided. In this embodiment, the substrate may be a single-layer circuit board or a multi-layer circuit board. In addition, the substrate 110 may include a packaging region A1 and a peripheral region A2, as shown in FIG. 1A. In this embodiment, the peripheral region A2 may be connected to the packaging region A1 and surround the packaging region A1, as shown in FIG. 2. Here, it should be noted that the peripheral region A2 in FIG. 2 is only shown for an illustrative purpose, and the invention is not limited thereto. In other embodiments of the invention, the peripheral region A2 may be merely located at one side of the packaging region A1 without surrounding the whole packaging region A1.

A manufacturing process of the substrate 110 may include forming a plurality of pads 130 on an upper surface 114 of the substrate 110. The pads 130 are located within the packaging region A1, and may be connected to corresponding vias 132 on the substrate 110, for example, so as to be electrically connected to a circuit layer 134 on the other side of the substrate 110 through the vias 132. Then, a patterned solder mask 140 may be further formed on the upper surface 114. The patterned solder mask 140 may have a plurality of openings 142 and each of the openings 142 exposes at least a portion of the corresponding pad 130. Then, a surface finishing layer 150 is formed on the pads 130 exposed by the patterned solder mask 140 to form the substrate 110 shown in FIG. 1A. In this embodiment, a material of the surface finishing layer is gold, nickel, silver, or other suitable materials.

Figure 1B:
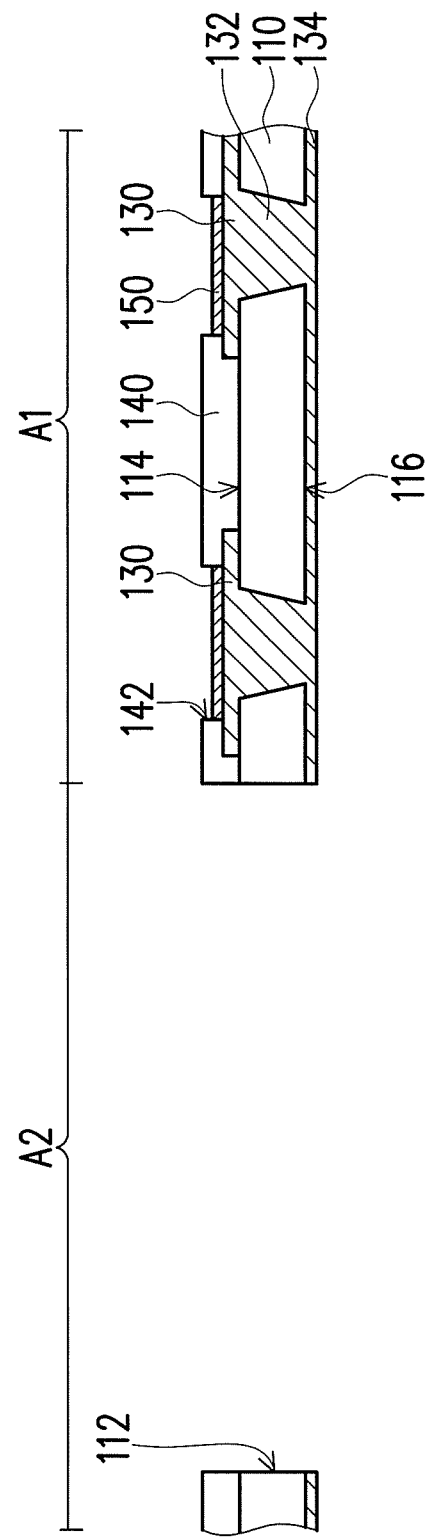
Figure 2:
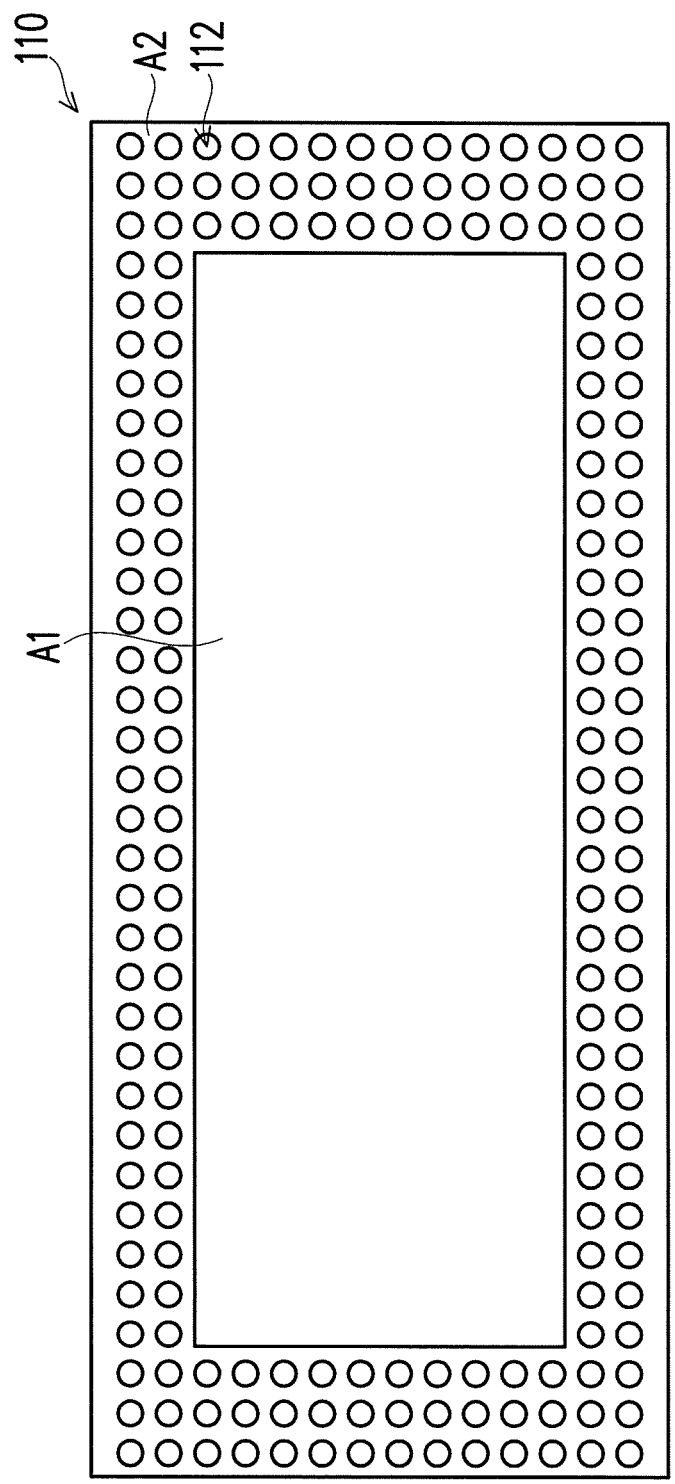
FIG. 2 is a top schematic view illustrating a substrate according to an embodiment of the invention.

Referring to FIGS. 1B and 2, a plurality of through holes 112 are formed in the peripheral region A2, so as to form the substrate 110 shown in FIG. 2. In this embodiment, the substrate 110 includes the upper surface 114 and a lower surface 116 opposite to each other, and the through holes 112 connect the upper surface 114 and the lower surface 116, as shown in FIG. 1B.

Figure 1C:
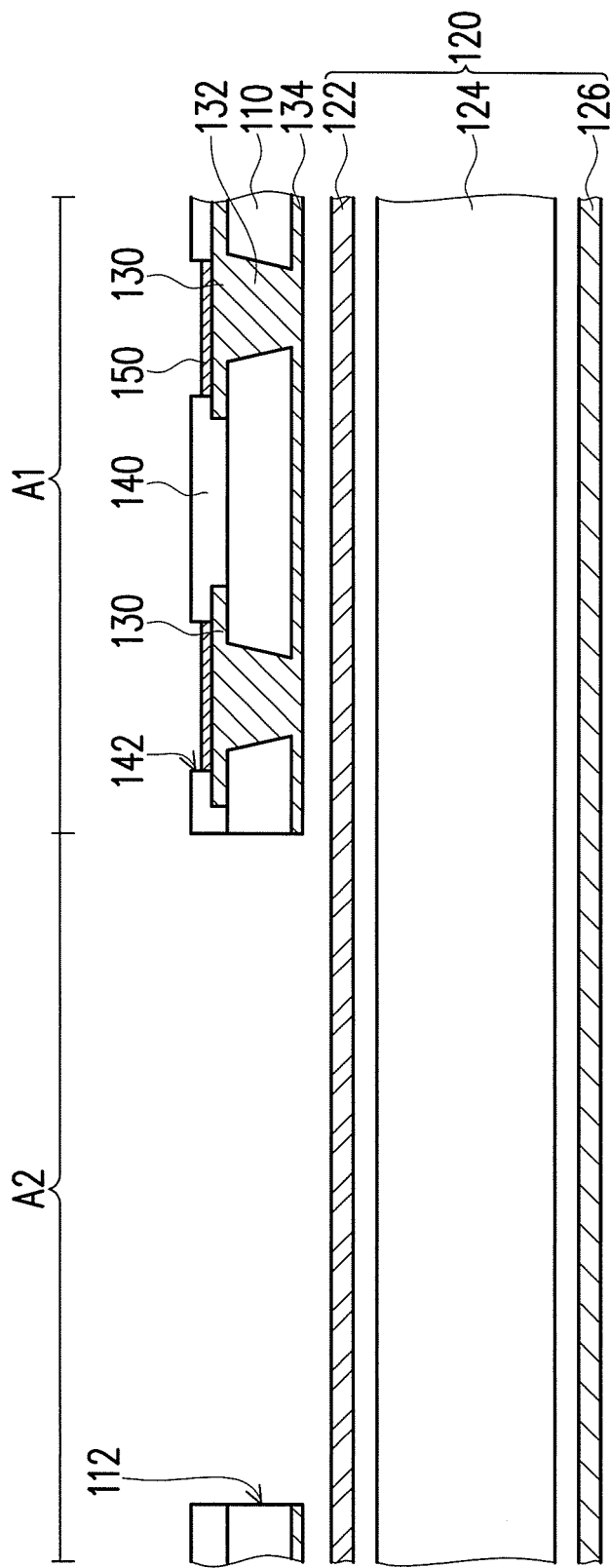

Then, a carrier 120 shown in FIG. 1C is provided. It should be noted that in FIG. 1C, the carrier is shown in exploded view. The carrier 120 includes a release layer 122, a dielectric layer 124, and a metal layer 126. In addition, the dielectric layer 124 is disposed between the release layer 122 and the metal layer 126. In this embodiment, a material of the release layer may include an aluminum foil or a polyimide film (PI film), a material of the dielectric layer 124 may include prepreg (PP), and a material of the metal layer 126 may be copper foil, for example. Naturally, the embodiment only serves for an illustrative purpose, and the invention is not limited thereto.

Figure 1D:
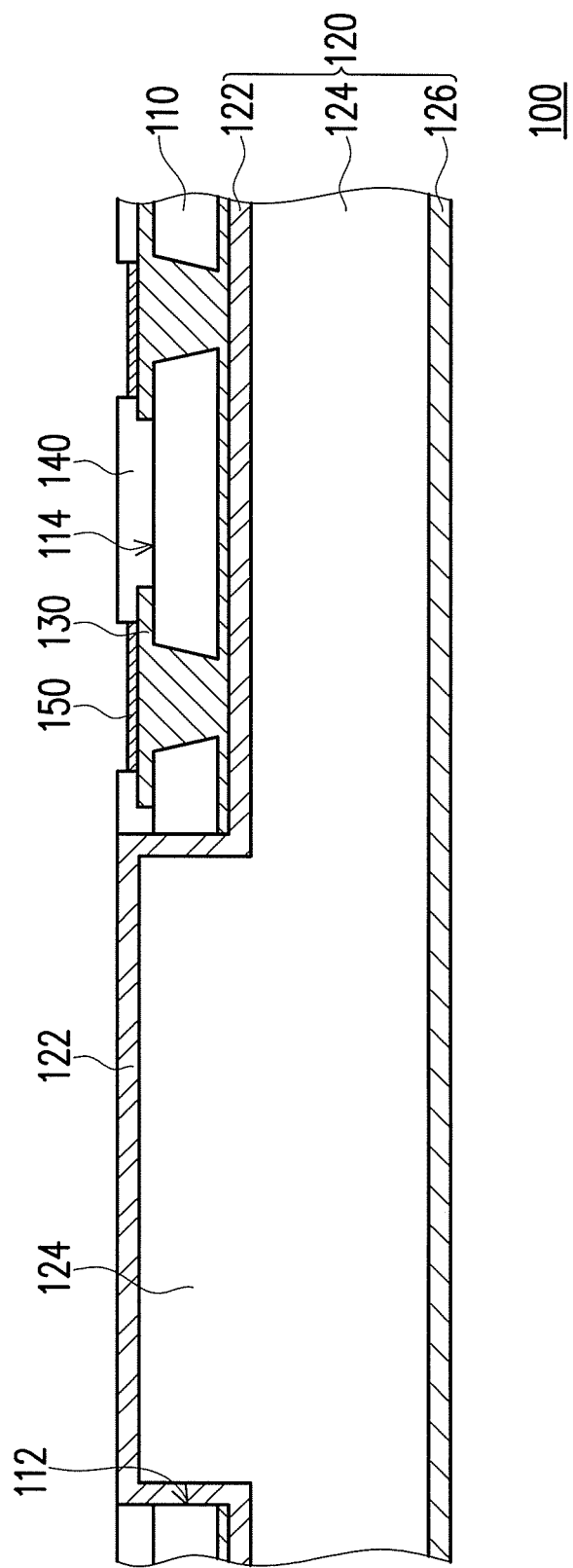

Referring to FIGS. 1C and 1D, the substrate 110 is laminated onto the release layer 122 of the carrier 120, such that the release layer 122 and the dielectric layer 124 are filled into the through holes 112, as shown in FIG. 1D. In addition, the release layer 122 is located between the substrate 110 and the dielectric layer 124 and contacts an inner wall of each of the through holes 112, such that the substrate 110 may be separably attached to the carrier 120. Thus, preliminary manufacture of the substrate structure 100 is completed.

As shown in FIG. 1D, the substrate structure 100 formed by the manufacturing method includes the substrate 110 and the carrier 120. As shown in FIG. 2, the substrate 110 includes the packaging region A1 and the peripheral region A2. In addition, the peripheral region A2 has the plurality of through holes 112 and is connected to the packaging region A1, and the peripheral region A2 surrounds the packaging region A1. In this embodiment, the substrate 110 may further include the plurality of pads 130, the patterned solder mask 140, and the surface finishing layer 150. The pads 130 are located within the packaging region A1 of the substrate 110 and connected to the corresponding vias 132, so as to be electrically connected to the circuit layer 134 on the other side of the substrate 110 through the vias 132. The patterned solder mask 140 covers the upper surface 114 of the substrate and exposes the pads 130. The surface finishing layer 150 covers the pads 130 exposed by the patterned solder mask 140. In this embodiment, a material of the surface finishing layer 150 is gold, nickel, silver, or other suitable materials.

Based on the above, the carrier 110 includes the release layer 122, the dielectric layer 124, and the metal layer 126. In addition, the dielectric layer 124 is disposed between the release layer 122 and the metal layer 126. The substrate 110 is disposed on the release layer 122 of the carrier 120, and the release layer 122 and the dielectric layer 124 are filled in the through holes 112, such that the release layer 122 is located between the substrate 110 and the dielectric layer 124 and contacts an inner wall of each through hole 112, so as to separably attach the substrate 110 to the carrier 120.

Given the configuration, the release layer 122 and the dielectric layer 124 of the carrier 120 are pressed and filled into the through holes 112 of the substrate 110 by laminating the substrate 110 to the carrier 120, thereby enhancing a bonding strength between the substrate 110 and the carrier 120. In addition, by utilizing a characteristic that the release layer 122 is easily separated from the substrate 110, the substrate 110 may be easily separated from the carrier 120 without being damaged after a subsequent packaging process is completed. Thus, the embodiment not only enhances the bonding strength between the substrate 110 and the carrier 120 in the substrate structure 100, but reduces a manufacturing difficulty and increases a yield rate of the manufacturing process.

Figure 3:
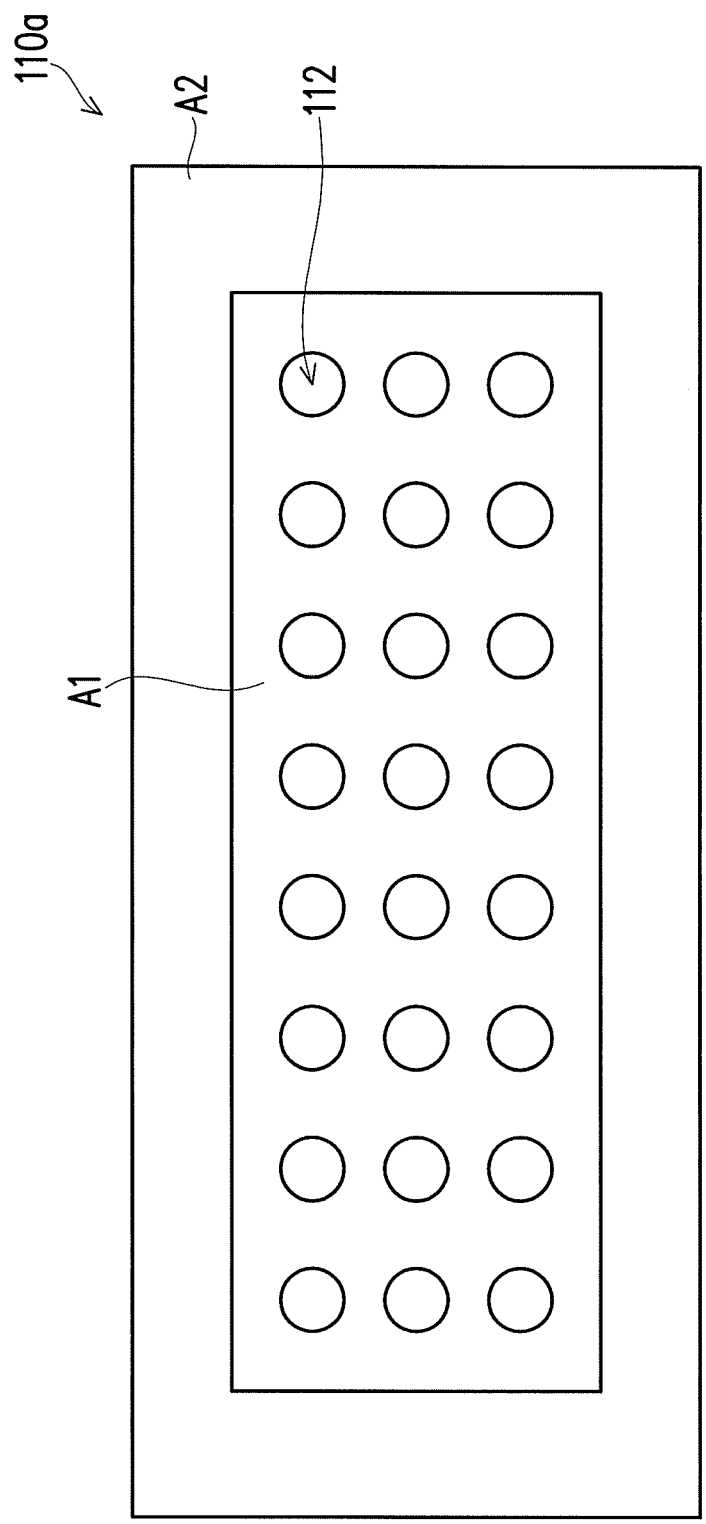
FIG. 3 is a top schematic view illustrating a substrate according to an embodiment of the invention.

FIG. 3 is a top schematic view illustrating a substrate according to an embodiment of the invention. FIGS. 4A to 4E are cross-sectional schematic views illustrating the processes of a manufacturing method of a substrate structure according to an embodiment of the invention. It should be noted that a substrate structure 100a of this embodiment is similar to the substrate structure 100. Therefore, the reference numerals and a part of the contents in the previous embodiment are used in the this embodiment, in which identical reference numerals indicate identical or similar components, and repeated description of the same technical contents is omitted. For a detailed description of the omitted parts, reference can be found in the previous embodiment, and no repeated description is contained in this embodiment. Detailed description regarding the difference between the substrate structure 100a of this embodiment and the substrate structure 100 in the previous embodiment is provided below.

Figure 4C:
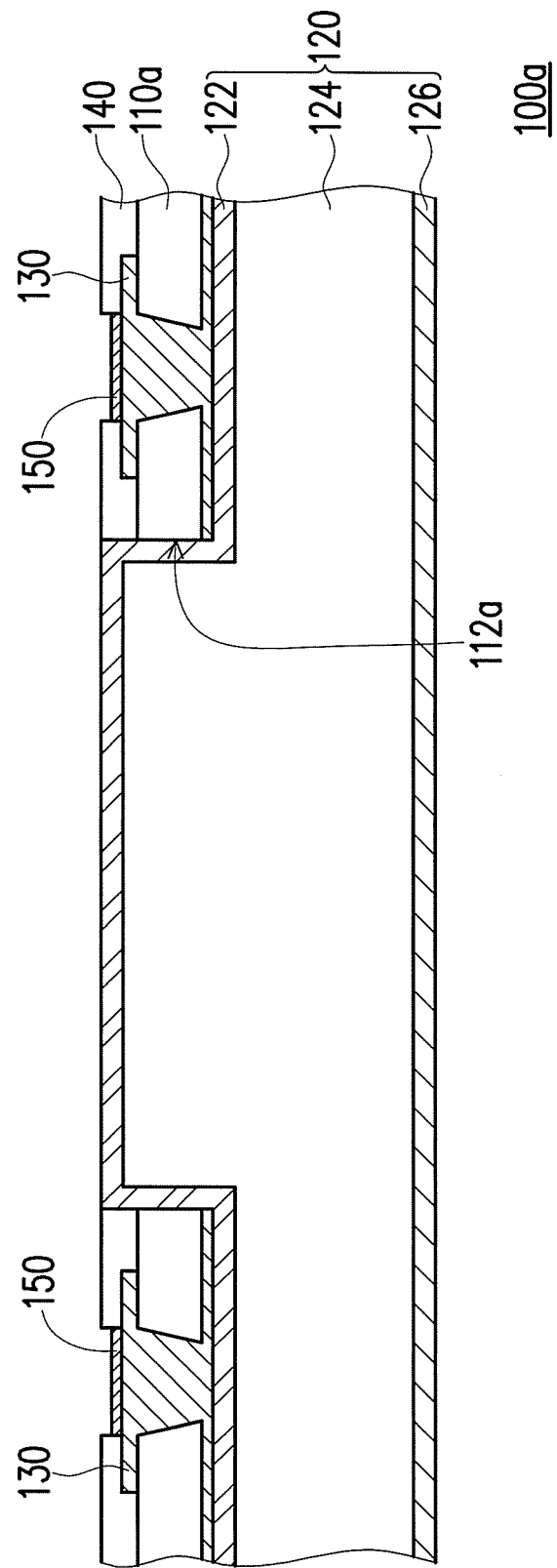

Referring to FIGS. 3 and 4A, the manufacturing method of the substrate structure of this embodiment includes steps as follows. First of all, as shown in FIG. 1A, a substrate 110a is provided. In this embodiment, the substrate 110a may be a single-layer circuit board or a multi-layer circuit board. In addition, as shown in FIG. 3, the substrate 110a may include the packaging region A1 and the peripheral region A2. As described in the previous embodiment, the peripheral region A2 is connected to the packaging region A1 and surrounds the packaging region A1. It should be noted that FIGS. 4A to 4E only illustrate partial cross-sections of the packaging region A1 without illustrating partial cross-sections of the peripheral region A2.

A manufacturing process of the substrate 110a of this embodiment is similar to the manufacturing process of the substrate 110. Namely, the plurality of pads 130 may also be formed on the packaging region A1 of the substrate 110a, and then the patterned solder mask 140 is formed on the substrate 110a. The patterned solder mask 140 covers the upper surface 114 of the substrate 110a and exposes the pads 130. Then, the surface finishing layer 150 is formed on the pads 130 exposed by the patterned solder mask 140. However, through holes 112a of this embodiment are formed in the packaging region A1 of the substrate 110a, and the pads 130 may be disposed around the through holes 112a, for example.

Then, the carrier 120 shown in FIG. 4B is provided. Like the carrier 120 of the previous embodiment, the carrier 120 of this embodiment also includes the release layer 122, the dielectric layer 124, and the metal layer 126. Relevant technical contents may be referred to the previous embodiment, and no further details in this respect will be reiterated below. Then, as shown in FIG. 4C, the substrate 110a is laminated to the release layer 122 of the carrier 120, such that the release layer 122 and the dielectric layer 124 are pressed and filled into the through holes 112a located within the packaging region A1, as shown in FIG. 4C. In addition, the release layer 122 is located between the substrate 110a and the dielectric layer 124 and contacts an inner wall of each through hole 112a, as shown in FIG. 4C, so as to separably attach the substrate 110a to the carrier 120. Thus, preliminary manufacture of the substrate structure 100a is completed.

The substrate structure 100a formed by the manufacturing method is similar to the substrate structure 100 of the previous embodiment, except that the through holes 112a are disposed in the packaging region A1 of the substrate 110a. Therefore, in this embodiment, the release layer 122 and the dielectric layer 124 of the carrier 120 are pressed and filled into the through holes 112a of the packaging region A1 of the substrate 110a, so as to preserve a space for filling a heat dissipation paste or liquid, preserve a space to be conductive for ventilation, or preserve a sensing space for a sensing element of a chip on the substrate structure 100a, for example.

Figure 4D:
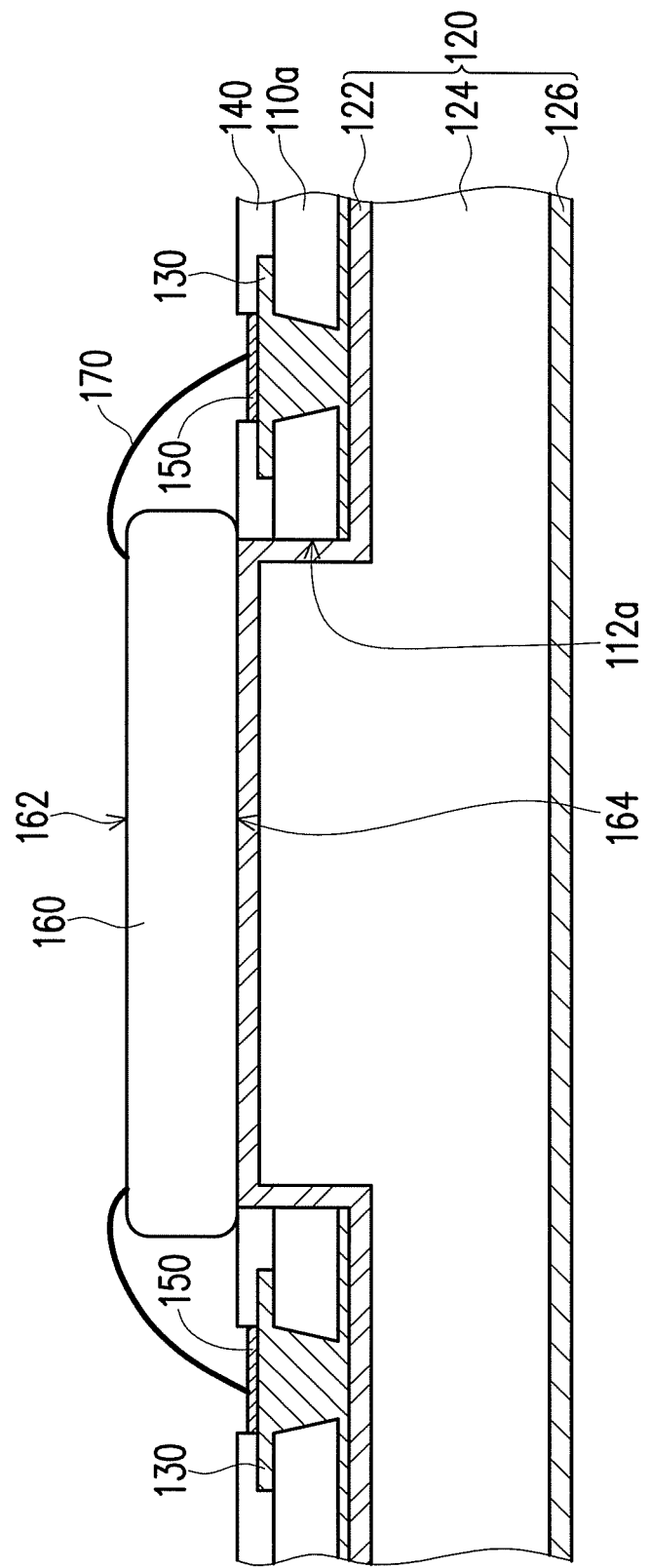

For example, as shown in FIG. 4D, a chip 160 may be further disposed in the packaging region A1 of the substrate 110a in this embodiment. The chip 160 covers one of the through holes 112a and contacts the release layer 122 in the through holes 112a. Then, the chip 160 is electrically connected to the pads 130 by a plurality of wires 170, so as to fix the chip 160 to the substrate 110a and be electrically connected to the substrate 110a. In this embodiment, the chip 160 includes an active surface 162 and a back surface 164 opposite to the active surface 162. The wires 170 are connected to the active surface 162 of the chip 160.

Figure 4E:
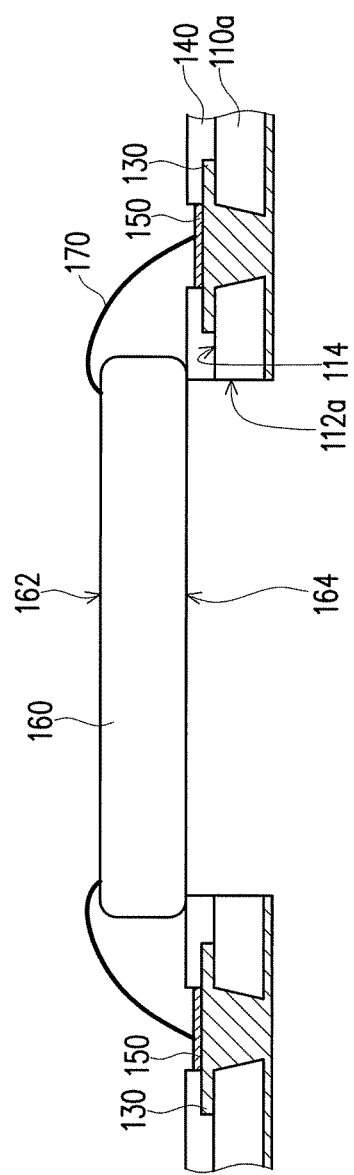

Then, as shown in FIG. 4E, the carrier 120 is removed to expose the back surface 164 of the chip 160 by utilizing the characteristic that the release layer 122 is easily separated from the substrate 110a. Accordingly, with the back surface 164 of the chip 160 exposed, a chip package formed by the aforementioned manufacturing process is able to provide a sensing space for a sensing element of the chip 160. For example, the chip 160 may include a light-sensing element, a sound-sensing element, or a touch-sensing element. Thereby, a light-sensing region of the light-sensing element, a resonant region (i.e. vibrating region) of the sound-sensing element or a touch region of the touch-sensing element located at the back surface 164 may be exposed through the through holes 112a of the substrate 110a, so as to enhance the performance of the chip. Alternatively, the chip 160 may also utilize the back surface 164 exposed by the through holes 112a for heat dissipation or ventilation. Or, a heat dissipation paste or liquid maybe filled in the through holes 112a to facilitate heat dissipation efficiency. Therefore, this embodiment is capable of increasing a functionality of the chip 160.

In view of the foregoing, in the invention, the substrate is laminated to the carrier so the release layer and the dielectric layer of the carrier are pressed and filled into the through holes of the substrate, so as to enhance the bonding strength between the substrate and the carrier. In addition, by utilizing the characteristic that the release layer is easily separated from the substrate, the substrate may be easily separated from the carrier without being damaged after the subsequent packaging process is completed. Thus, the invention not only enhances the bonding strength between the substrate and the carrier in the substrate structure, but reduces the manufacturing difficulty and increases the yield rate of the manufacturing process.

In addition, if the through holes of the substrate are located within the packaging region of the substrate and the chip is disposed on the packaging region to cover the through holes, the through holes of the substrate then exposes the surface of the chip after the carrier is separated from the substrate by utilizing the release layer. Thereby, the sensing space of the sensing element of the chip, which may serve as the light-sensing region of the light-sensing element, the resonant region (vibrating region) of the sound-sensing element, and the touch region of the touch-sensing element, may be provided. Alternatively, the chip may utilize the surface exposed by the through holes for heat dissipation or ventilation. Besides, the heat dissipation paste may be filled in the through holes, so as to facilitate the heat dissipation efficiency of the chip. Therefore, the invention also increases the functionality of the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a substrate structure, comprising:
    providing a substrate, comprising a packaging region and a peripheral region, wherein the peripheral region is connected to the packaging region and surrounds the packaging region;
    forming a plurality of through holes in the packaging region;
    providing a carrier, wherein the carrier comprises a release layer, a dielectric layer, and a metal layer, the dielectric layer being disposed between the release layer and the metal layer;
    laminating the substrate to the release layer of the carrier, such that the release layer and the dielectric layer are filled into the through holes to separably attach the substrate to the carrier;
    packaging a chip on the packaging region of the substrate, wherein the chip directly contacts the release layer filled into the through holes; and
    separating the chip and the substrate from the release film and the carrier to expose the back surface of the chip after packaging the chip on the substrate.

2. The manufacturing method of the substrate structure as claimed in claim 1, wherein the step of providing the substrate further comprises:
    forming a plurality of pads on an upper surface of the substrate, the pads being located in the packaging region and disposed around the through holes; and
    forming a patterned solder mask on the upper surface, and the patterned solder mask exposing the pads.

3. The manufacturing method of the substrate structure as claimed in claim 2, wherein the dielectric layer directly contacts with the release layer, the release layer contacts with inner walls of the through holes, and a first top surface of the release layer in the through holes is substantially coplanar with a second top surface of the patterned solder mask.

4. The manufacturing method of the substrate structure as claimed in claim 1, wherein the chip covers one of the through holes and contacting the release layer.

5. The manufacturing method of the substrate structure as claimed in claim 2, further comprising:
    electrically connecting the chip to the pads via a plurality of wires.

* * * * *